United States Patent
Jeon et al.

(10) Patent No.: US 9,752,941 B2
(45) Date of Patent: Sep. 5, 2017

(54) PRESSURE SENSOR AND PRESSURE SENSING METHOD

(71) Applicants: SAMSUNG ELECTRONICS CO., LTD., Suwon-si (KR); Sungkyunkwan University Foundation for Corporate Collaboration, Suwon-si (KR)

(72) Inventors: Sang-hun Jeon, Seoul (KR); Jong-jin Park, Hwaseong-si (KR); Thanh Tien Nguyen, Suwon-si (KR); Ji-hyun Bae, Seoul (KR); Kyung-eun Byun, Uijeongbu-si (KR); Nae-eung Lee, Suwon-si (KR); Do-il Kim, Daegu (KR); Quang Trung Tran, Suwon-si (KR)

(73) Assignees: SAMSUNG ELECTRONICS CO., LTD., Suwon-si (KR); SUNGKYUNKWAN UNIVERSITY FOUNDATION FOR CORPORATE COLLABORATION, Suwon-si (KR)

( * ) Notice: Subject to any disclaimer, the term of this patent is extended or adjusted under 35 U.S.C. 154(b) by 691 days.

(21) Appl. No.: 14/018,505

(22) Filed: Sep. 5, 2013

(65) Prior Publication Data

US 2014/0060210 A1 Mar. 6, 2014

(30) Foreign Application Priority Data

Sep. 5, 2012 (KR) ........................ 10-2012-0098486

(51) Int. Cl.
  *G01L 1/16* (2006.01)
  *H01L 29/84* (2006.01)
(52) U.S. Cl.
  CPC ................ *G01L 1/16* (2013.01); *H01L 29/84* (2013.01)

(58) Field of Classification Search
  CPC .................................. G01L 1/16; H01L 29/84
  (Continued)

(56) References Cited

U.S. PATENT DOCUMENTS 4,079,307 A * 3/1978 Hazumi .................. H02P 9/305
   322/32
6,832,178 B1 12/2004 Fernandez et al.
(Continued)

FOREIGN PATENT DOCUMENTS

CN     102098956 A    6/2011
JP     2005-249644 A  9/2005
(Continued)

OTHER PUBLICATIONS

Graz, et al, "Flexible ferroelectret field-effect transistor for large-area sensor skins and microphones", Applied Physics Letter, 89, 073501 (2006); doi: 10.1063/1.2335838, published online Aug. 14, 2006, Total 4 pages, http://dx.doi.org/10.1063/1.2335838, American Institute of Physics.

(Continued)

*Primary Examiner* — Lisa Caputo
*Assistant Examiner* — Octavia Hollington
(74) *Attorney, Agent, or Firm* — Sughrue Mion, PLLC

(57) ABSTRACT

A pressure sensor and a pressure sensing method are provided. The pressure sensor includes a substrate; a sensor thin film transistor (TFT) disposed on the substrate and including a gate insulating layer, wherein the gate insulating layer includes an organic matrix in which piezoelectric inorganic nano-particles are dispersed; a power unit configured to apply an alternating current (AC) signal to a gate of the sensor TFT; and a pressure sensing unit configured to obtain a remnant polarization value based on a drain current which (Continued)

is generated in response to the AC signal and detected by the sensor TFT, and to sense a pressure based on the remnant polarization value.

19 Claims, 13 Drawing Sheets

(58) Field of Classification Search
USPC ..................................................... 73/862.68
See application file for complete search history.

(56) References Cited

U.S. PATENT DOCUMENTS

| | | | | |
|---|---|---|---|---|
| 7,897,430 | B2* | 3/2011 | Kim | ................ C01G 1/02 257/40 |
| 8,108,157 | B2 | 1/2012 | Chase et al. | |
| 8,118,618 | B2 | 2/2012 | Richmond, II et al. | |
| 8,476,121 | B2* | 7/2013 | Burroughes | ........ H01L 51/0013 257/E21.37 |
| 8,519,449 | B2* | 8/2013 | Dumitru | ................ B82Y 10/00 257/254 |
| 2007/0120208 | A1* | 5/2007 | Mitra | ................ H01L 29/1029 257/417 |
| 2009/0066345 | A1* | 3/2009 | Klauk | ................ G06K 9/00053 324/661 |
| 2011/0000060 | A1 | 1/2011 | Lee et al. | |
| 2011/0049579 | A1 | 3/2011 | Dumitru et al. | |
| 2011/0109203 | A1 | 5/2011 | McAlpine et al. | |
| 2011/0184271 | A1 | 7/2011 | Veciana et al. | |

FOREIGN PATENT DOCUMENTS

| | | |
|---|---|---|
| JP | 2007-530957 A | 11/2007 |
| JP | 2009-060056 A | 3/2009 |
| KR | 10-2011-0013560 A | 2/2011 |
| KR | 10-1073633 B1 | 10/2011 |

OTHER PUBLICATIONS

Graz, et al., "Flexible active-matrix cells with selectively poled bifunctional polymerceramic nanocomposite for pressure and temperature sensing skin", Applied Physics Letter, 106, 034503 (2009); doi: 10.1063/1.3191677, published online Aug. 11, 2009, Total 6 pages, http://dx.doi.org/10.1063/1.3191677, American Institute of Physics.

* cited by examiner

PRESSURE SENSOR AND PRESSURE SENSING METHOD

CROSS-REFERENCE TO RELATED APPLICATION

This application claims the priority of Korean Patent Application No. 10-2012-0098486, filed on Sep. 5, 2012, in the Korean Intellectual Property Office, the disclosure of which is incorporated herein in its entirety by reference.

BACKGROUND

1. Field

The present disclosure relates to pressure sensors and pressure sensing methods thereof, and more particularly, to pressure sensors integrated as thin film transistors (TFTs) and pressure sensing methods thereof.

2. Description of the Related Art

In order to realize flexible electronic components, components and materials for forming the components have to be mechanically reliable, as well as have excellent electric characteristics. To achieve these flexible electronic components, much research into material science/engineering has been conducted. Such technology may be applied to stretchable electronic components, as well as flexible electronic components.

Related art organic materials may be manufactured on a flexible substrate through a low temperature process; however, they do not have excellent piezoelectric characteristics. On the other hand, related art inorganic materials may have excellent piezoelectric characteristics; however, they may be applied to a hard substrate but may not be applied to a flexible substrate because a high temperature process is necessary. That is, the organic and inorganic materials both have technical issues making it difficult for such materials to be applied to pressure sensors for an electronic skin. Thus, a material that is flexible, may be processed under a low temperature, and may have excellent piezoelectric characteristics is needed.

SUMMARY

Exemplary embodiments provide pressure sensors integrated as thin film transistors (TFTs) on a flexible substrate and pressure sensing methods.

According to an aspect of an exemplary embodiment, there is provided a pressure sensor including: a substrate; a sensor thin film transistor (TFT) disposed on the substrate and comprising a gate insulating layer, wherein the gate insulating layer comprises an organic matrix in which piezoelectric inorganic nano-particles are dispersed; a power unit configured to apply an alternating current (AC) signal to a gate of the sensor TFT; and a pressure sensing unit configured to obtain a remnant polarization value based on a drain current which is generated in response to the AC signal and detected by the sensor TFT, and to sense pressure based on the remnant polarization value.

When an amplitude of the AC signal applied to the gate is $V_G^{amp}$, an amplitude of the drain current is $I_D^{amp}$, and an average drain current value is $I_D^{mean}$, the remnant polarization value may be in proportion to a value of $$V_G^{amp} \frac{I_D^{mean}}{I_D^{amp}},$$

and the pressure sensor may be configured to sense the pressure by using a variation in the remnant polarization value.

The AC signal may have a frequency ranging from about 0.001 Hz to about 1 GHz.

A voltage amplitude of the AC signal may range from 0.01 V to 100 V.

The organic matrix may include a piezoelectric organic material.

The piezoelectric organic material may be selected from P(VDF-TrFE), P(VDF-TrFE-CFE), and P(VDF-TrFE-CtFE).

The organic matrix may have a crystalline structure.

The piezoelectric inorganic nano-particles may be selected from the group consisting of gallium orthophosphate ($GaPO_4$), langasite ($La_3Ga_5SiO_{14}$), a quartz analogic crystal, barium titanate ($BaTiO_3$), lead titanate ($PbTiO_3$), lead zirconate titanate ($Pb[Zr_xTi_{1-x}]O_3$ ($0 \leq x \leq 1$), potassium niobate ($KNbO_3$), lithium niobate ($LiNbO_3$), lithium tantalate ($LiTaO_3$), sodium tungstate ($Na_2WO_3$), zinc oxide ($Zn_2O_3$), $Ba_2NaNb_5O_5$, $Pb_2KNb_5O_{15}$, sodium potassium niobate (($K,Na)NbO_3$), bismuth ferrite ($BiFeO_3$), sodium niobate ($NaNbO_3$), bismuth titanate ($Bi_4Ti_3O_{12}$), and sodium bismuth titanate ($Na_{0.5}Bi_{0.5}TiO_3$).

The pressure sensor may further include a switching TFT that is electrically connected to the sensor TFT, wherein a sensor pixel structure of the pressure sensor comprises one switching TFT and one sensor TFT.

The organic matrix may have a crystalline structure.

The organic matrix may be formed to have the crystalline structure through an annealing process which implements a temperature of 120° C. or higher.

The substrate may be a flexible substrate.

The substrate may be formed of a material including polyimide.

According to an aspect of another exemplary embodiment, there is provided a pressure sensing method including: applying an alternating current (AC) signal to a gate of a sensor thin film transistor (TFT) comprising a piezoelectric gate insulating layer; detecting a drain current from the sensor TFT, the drain current being generated in response to the AC signal; and obtaining a remnant polarization value based on the drain current and sensing a pressure based on the remnant polarization value.

The piezoelectric gate insulating layer may include an organic matrix, in which piezoelectric inorganic nano-particles are dispersed.

BRIEF DESCRIPTION OF THE DRAWINGS

The above and/or other aspects will become apparent and more readily appreciated from the following description of exemplary embodiments, taken in conjunction with the accompanying drawings of which.

DETAILED DESCRIPTION

Figure 1:
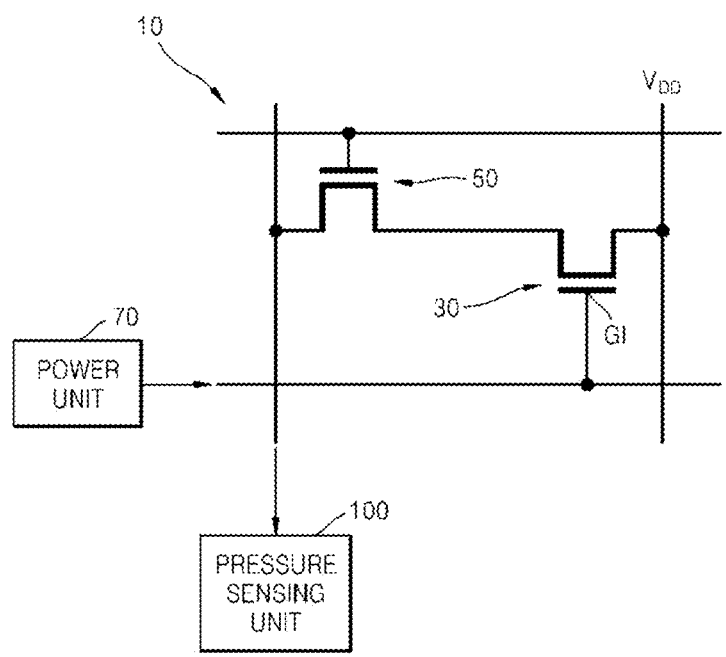
FIG. 1 is an equivalent circuit diagram showing a pressure sensor according to an exemplary embodiment.

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present description. It will be understood that when an element or layer is referred to as being "on" another element or layer, the element or layer can be directly on another element or layer or intervening elements or layers. Expressions such as "at least one of," when preceding a list of elements, modify the entire list of elements and do not modify the individual elements of the list.

Figure 2:
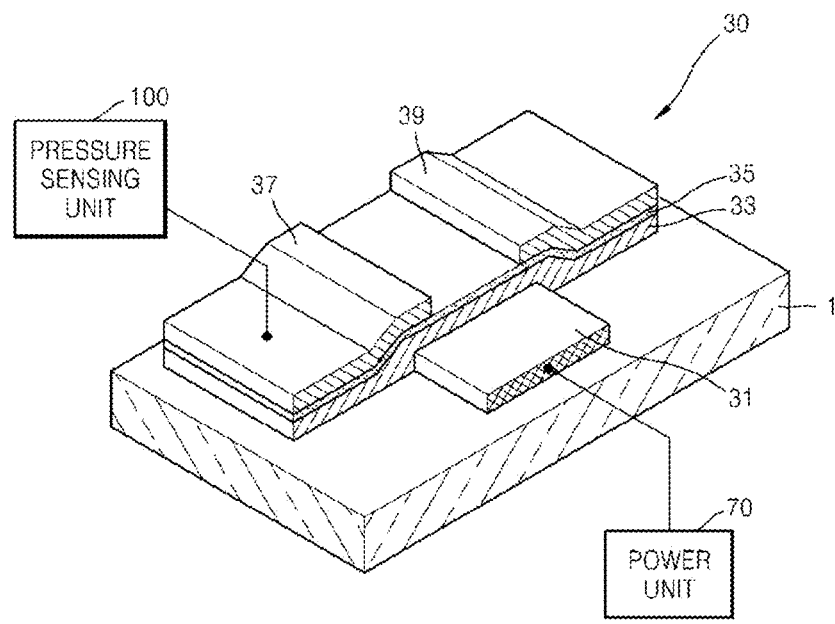
FIG. 2 is a schematic perspective view of a sensor thin film transistor (TFT) of a pressure sensor according to an exemplary embodiment.
Figure 3:
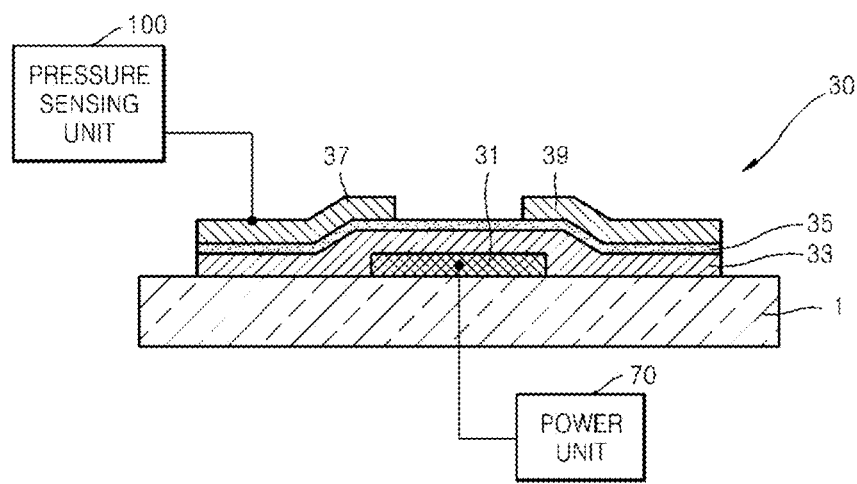
FIG. 3 is a cross-sectional view of the sensor TFT of FIG. 2.

FIG. 1 is an equivalent circuit diagram schematically showing a pressure sensor 10 according to an exemplary embodiment, FIG. 2 is a schematic perspective view of a sensor thin film transistor (TFT) 30 of the pressure sensor 10 according to an exemplary embodiment, and FIG. 3 is a cross-sectional view of the sensor TFT 30 of FIG. 2.

Referring to FIGS. 1 through 3, the pressure sensor 10 according to an exemplary embodiment includes the sensor TFT 30 having a piezoelectric gate insulating layer 33, a power unit 70 configured to apply an alternating current (AC) signal, that is, an AC voltage, to a gate G1 of the sensor TFT 30, and a pressure sensing unit 100 configured to obtain a remnant polarization value (Pr) by using a drain current obtained from the sensor TFT 30 and sensing pressure therefrom (e.g., based on the remnant polarization value). The pressure sensor 10 may further include a switching TFT 50 for addressing the sensor TFT 30. As described above, in a case where the pressure sensor 10 further includes the switching TFT 50 that is electrically connected to the sensor TFT 30, the pressure sensor 10 may have a structure in which a sensor pixel includes one switching TFT 50 and one sensor TFT 30. In the pressure sensor 10, a pair including a switching TFT 50 and a sensor TFT 30 forms a pixel among a plurality of pixels, and the pixels may be arranged in a two-dimensional array.

Referring to FIGS. 2 and 3, the sensor TFT 30 includes a gate electrode 31 formed on a substrate 1, a gate insulating layer 33 covering the gate electrode 31, a channel layer 35 formed on the gate insulating layer 33, and a source electrode 37 and a drain electrode 39 that are formed on the channel layer 35 to be separated from each other. In FIG. 2, the sensor TFT 30 has a bottom-gate structure, which is an example, and it is understood that other structures may be implemented according to other exemplary embodiments. For example, in the pressure sensor 10 of an exemplary embodiment, the sensor TFT 30 may have a top-gate structure, in which the source and drain electrodes 37 and 39 are disposed under the channel layer 35, the gate insulating layer 33 is disposed on the channel layer 35, and the gate electrode 31 is disposed on the gate insulating layer 33. The gate electrode 31, the source electrode 37, and the drain electrode 39 may be formed of a metallic material.

The substrate 1 may be a flexible substrate. For example, the substrate 1 may be formed of a material including polyimide.

The gate insulating layer 33 may be a piezoelectric gate insulating layer. For example, the gate insulating layer 33 may include an organic matrix, in which piezoelectric inorganic nano-particles are dispersed.

The organic matrix is formed as a thin film for forming the gate insulating layer 33, and may be formed of a piezoelectric organic material. The organic matrix may be formed to have a crystalline structure through an annealing process which implements a temperature of about 120° or higher. The piezoelectric organic material for forming the organic matrix may be selected from, for example, P(VDF-TrFE), P(VDF-TrFE-CFE), and P(VDF-TrFE-CtFE).

The piezoelectric inorganic nano-particles may be dispersed in the organic matrix formed as the thin film. When the gate insulating layer 33 is formed of the organic matrix, in which the piezoelectric inorganic nano-particles are dispersed, the pressure sensor 10 may achieve advantages as a result of the organic material and the inorganic material. That is, the pressure sensor 10 having excellent piezoelectric characteristics may be formed on the substrate 1, that is, the flexible substrate, by using a low temperature process.

The piezoelectric inorganic nano-particles used in the gate insulating layer 33 may be selected from the group consisting of, for example, gallium orthophosphate ($GaPO_4$), langasite ($La_3Ga_5SiO_{14}$), a quartz analogic crystal, barium titanate ($BaTiO_3$), lead titanate ($PbTiO_3$), lead zirconate titanate ($Pb[Zr_xTi_{1-x}]O_3$ ($0 \leq x \leq 1$), potassium niobate ($KNbO_3$), lithium niobate ($LiNbO_3$), lithium tantalate ($LiTaO_3$), sodium tungstate ($Na_2WO_3$), zinc oxide ($Zn_2O_3$), $Ba_2NaNb_5O_5$, $Pb_2KNb_5O_{15}$, sodium potassium niobate (($K$, $Na$)$NbO_3$), bismuth ferrite ($BiFeO_3$), sodium niobate ($NaNbO_3$), bismuth titanate ($Bi_4Ti_3O_{12}$), and sodium bismuth titanate ($Na_{0.5}Bi_{0.5}TiO_3$). It is understood that the piezoelectric inorganic nano-particles may be selected from other materials as well.

As described above, the gate insulating layer 33 having the structure in which the piezoelectric inorganic nano-particles are dispersed in the organic matrix has a nano-compound form, and such a gate insulating layer 33 may have both characteristics of the organic material, that is, flexibility and processability at low temperatures, and characteristics of the inorganic material, that is, an improved piezoelectric coefficient characteristic.

Figure 4:
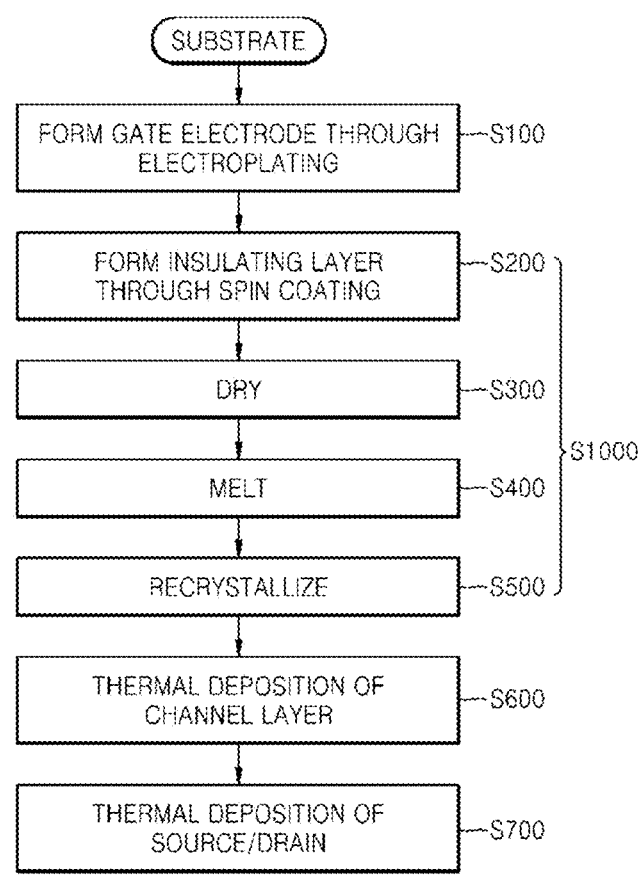
FIG. 4 is a flowchart illustrating a method of manufacturing a sensor TFT according to an exemplary embodiment.

The sensor TFT 30 may be manufactured through processes shown in, for example, FIG. 4. FIG. 4 exemplarily shows processes of manufacturing the sensor TFT 30 of the bottom-gate type shown in FIG. 2; however, the processes shown in FIG. 4 may be modified to form the sensor TFT 30 of the top-gate type or other types. The processes for manufacturing the top-gate type sensor TFT 30 may be inferred from the processes of manufacturing the bottom-gate type sensor TFT 30, and thus, detailed descriptions thereof are not provided here. The process of forming the sensor TFT 30 of the pressure sensor 10 is not limited to the example shown in FIG. 4, and may be modified in various ways.

Referring to FIG. 4, the gate electrode 31 may be formed on the substrate 1, for example, the substrate of a polyimide film type, through an electro-plating process at operation S100. The gate electrode 31 may be formed of a metal material including, for example, nickel (Ni).

After forming the gate electrode 31 as described above, the gate insulating layer 33 is formed to cover the gate electrode 31 at operation S1000, which includes operations S200, S300, S400 and S500.

The gate insulating layer 33 may be formed through a process of forming an insulating layer by spin-coating a piezoelectric nanocomposite, in which the piezoelectric inorganic nano-particles are dispersed in the piezoelectric organic material at operation S200, drying the insulating layer at operation S300, melting the insulating layer at operation S400, and re-crystallizing the insulating layer at operation S500. According to an exemplary embodiment, the melting of the insulating layer is performed by annealing the insulating layer at a temperature of, for example, about 200° C., and the recrystallization of the insulating layer may be performed by maintaining a temperature of 120° C. or higher, for example, at about 140° C., for about two hours.

According to an exemplary embodiment, a heat cycle including the melting and recrystallizing of the insulating layer may be additionally performed at least once in order to improve the crystallization and piezoelectric characteristics.

As described above, after forming the gate insulating layer 33, a channel layer 35 is formed on the gate insulating layer 33 as a Pentacene layer, for example, by using a semiconductor material at operation S600, and the source electrode 37 and the drain electrode 39 may be formed on the channel layer 35 at operation S700.

For example, the channel layer 35 may be formed using a thermal evaporation method. In addition, the source electrode 37 and the drain electrode 39 may be formed, for example, using the thermal evaporation method. The source and drain electrodes 37 and 39 may be formed of, for example, a metal material including gold (Au).

In the sensor TFT 30 as described above, a piezoelectric coefficient $d_{33}$ of the gate insulating layer 33 may be adjusted by adjusting a crystallizing temperature of the organic matrix and an amount of the piezoelectric inorganic nano-particles.

For example, a case where the gate insulating layer 33 is formed to have a structure in which the organic matrix is formed of P(VDF-TrFE) and $BaTiO_3$ piezoelectric inorganic nano-particles are dispersed in the P(VDF-TrFE) matrix, will be described below.

Figure 5:
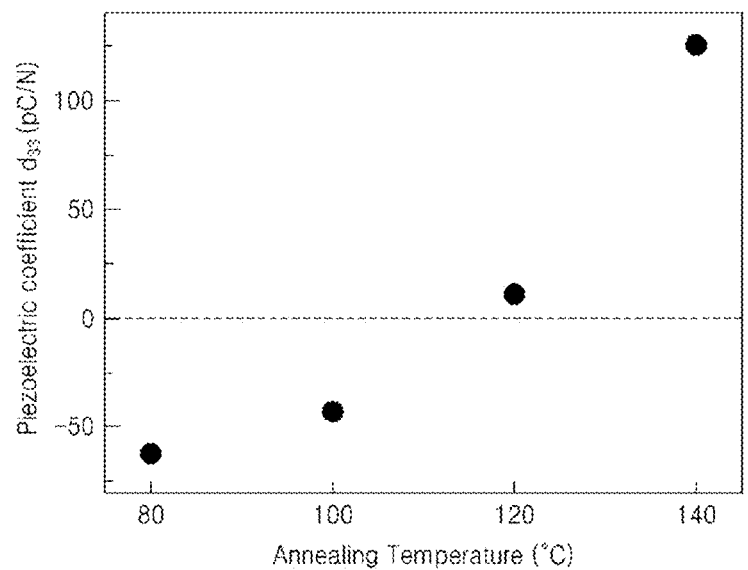
FIG. 5 is a graph showing a variation in a piezoelectric coefficient $d_{33}$ according to an annealing temperature in P(VDF-TrFE) according to an exemplary embodiment.

FIG. 5 is a graph showing a variation in the piezoelectric coefficient $d_{33}$ according to an annealing temperature of P(VDF-TrFE) according to an exemplary embodiment. As shown in FIG. 5, when the annealing temperature is equal to 100° C. or higher, for example, about 120° C. or 140° C., the piezoelectric coefficient $d_{33}$ of the organic matrix greatly improves.

Figure 6:
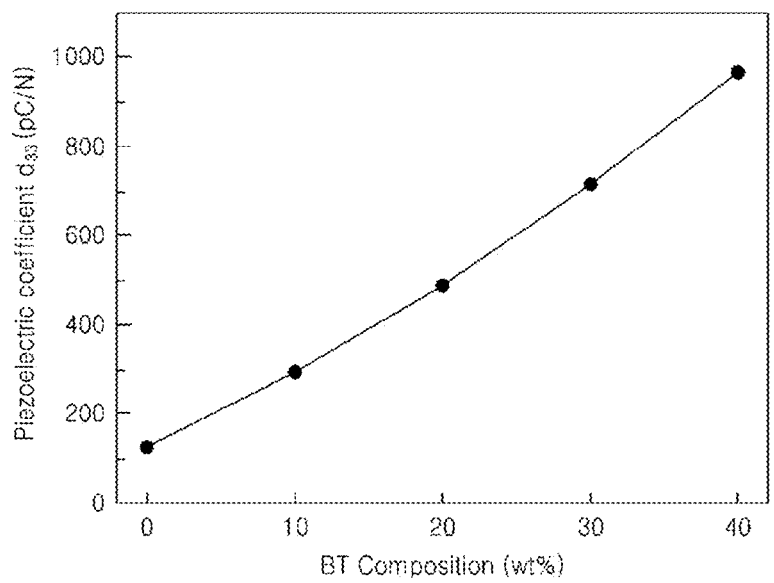
FIG. 6 is a graph showing a variation in the piezoelectric coefficient $d_{33}$ according to a content amount (wt %) of $BaTiO_3$ according to an exemplary embodiment.

FIG. 6 is a graph showing a variation in the piezoelectric coefficient $d_{33}$ according to a content amount (wt %) of $BaTiO_3$ according to an exemplary embodiment. As shown in FIG. 6, when the amount of the $BaTiO_3$ piezoelectric inorganic nano-particles is increased, the piezoelectric coefficient $d_{33}$ greatly improves.

Figure 7:
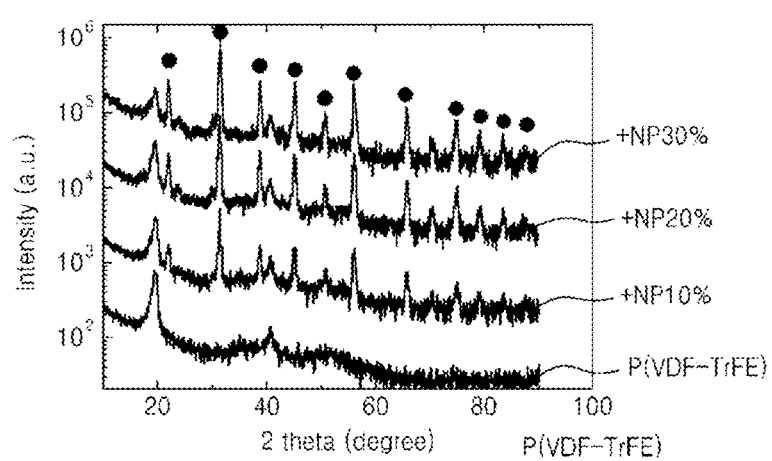
FIG. 7 is a graph showing a variation in an X-ray diffraction (XRD) pattern according to a variation in a content amount of $BaTiO_3$ piezoelectric inorganic nano-particles, when an organic matrix is formed of P(VDF-TrFE) and the $BaTiO_3$ piezoelectric inorganic nano-particles are dispersed in the P(VDF-TrFE) matrix, according to an exemplary embodiment.

FIG. 7 is a graph showing a variation in an X-ray diffraction (XRD) pattern according to a variation in the content amount of the $BaTiO_3$ piezoelectric inorganic nano-particles, when the organic matrix is formed of P(VDF-TrFE) and the $BaTiO_3$ piezoelectric inorganic nano-particles are dispersed in the P(VDF-TrFE) matrix, according to an exemplary embodiment. As shown in FIG. 7, which compares a case where the gate insulating layer 33 is only formed of the P(VDF-TrFE) matrix with cases where the amounts of the $BaTiO_3$ piezoelectric inorganic nano-particles dispersed in the P(VDF-TrFE) matrix are respectively 10%, 20%, and 30%, as the amount of the $BaTiO_3$ piezoelectric inorganic nano-particles in the P(VDF-TrFE) matrix increases, peak intensities of $BaTiO_3$ marked with a dot in FIG. 7 (i.e., marked as "•") increase. This comparison indicates that an amorphous phase shown when the gate insulating layer 33 is formed only of the P(VDF-TrFE) matrix is reduced.

As described above, the characteristics of the gate insulating layer 33 may be improved by adjusting the crystallizing temperature of the organic matrix and the amount of the piezoelectric inorganic nano-particles.

For example, when the organic matrix is formed of the P(VDF-TrFE), the piezoelectric characteristics are improved when the crystallizing temperature is increased, as shown in FIG. 5. Also, as shown in FIG. 6, the piezoelectric characteristics may be improved when the amount of the piezoelectric inorganic nano-particles dispersed in the organic matrix is increased.

FIGS. 8A, 8B, 9 and 10 show characteristics of a sample that is obtained by crystallizing the P(VDF-TrFE) in which the piezoelectric inorganic nano-particles are dispersed at a temperature of about 140° C. As a comparative example, FIGS. 11A, 11B, 12 and 13 show characteristics of a sample that is obtained by crystallizing the P(VDF-TrFE) in which the piezoelectric inorganic nano-particles are dispersed at a low temperature of about 80° C.

Figure 8A:
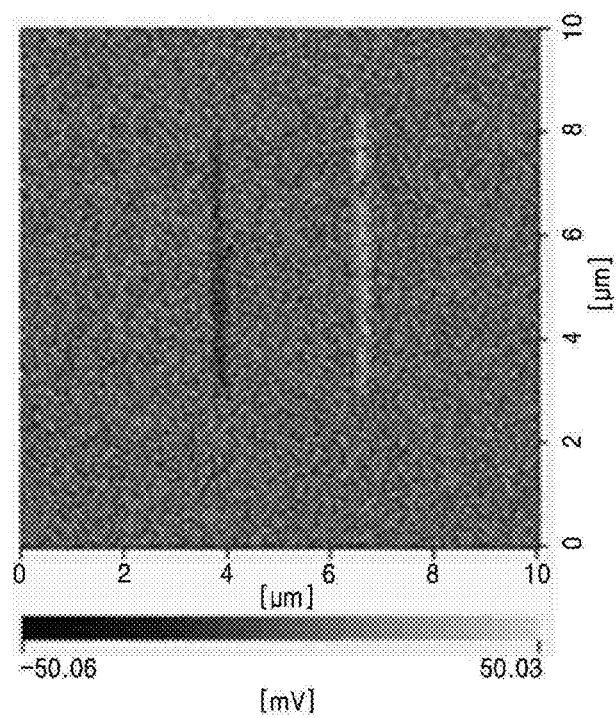
FIGS. 8A and 8B are polarization state images taken when polarization is generated and a predetermined time period (about 46 hours) has passed after the polarization, in a case where the P(VDF-TrFE) in which the piezoelectric inorganic nano-particles are dispersed is crystallized at a temperature of about 140° C., according to an exemplary embodiment.
Figure 8B:
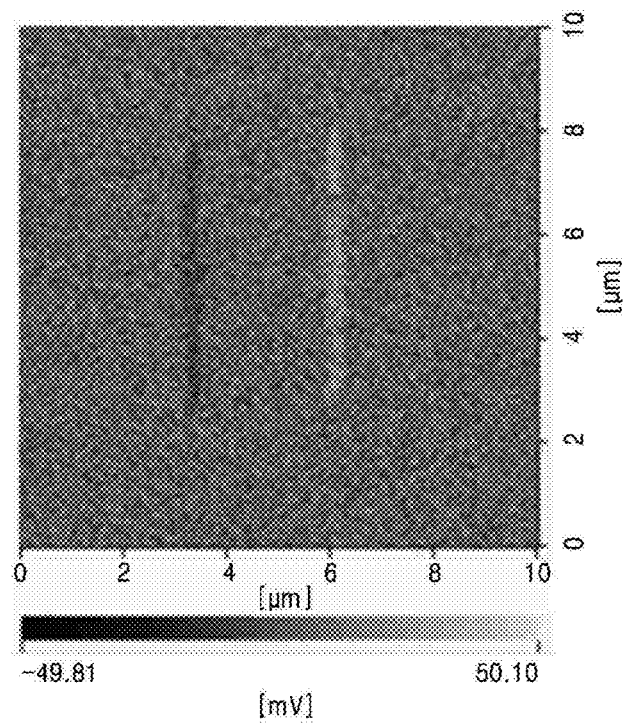
Figure 9:
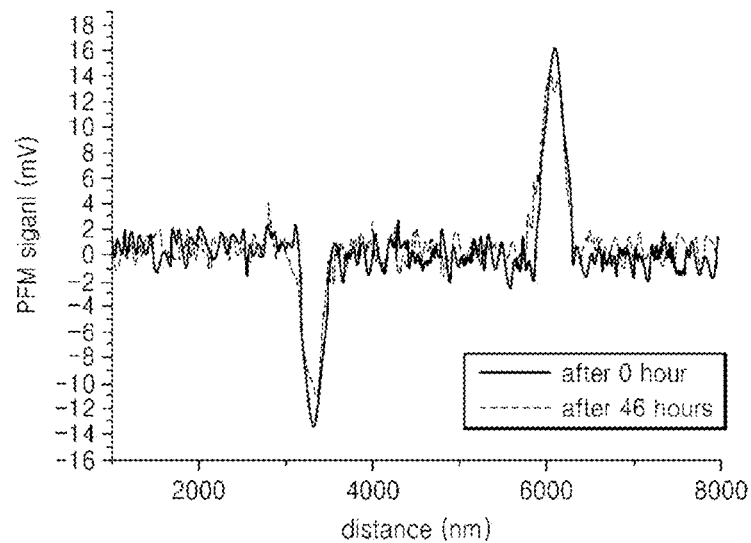
FIG. 9 is a graph showing a piezoelectric force microscopy (PFM) signal variation according to locations in the sample of FIGS. 8A and 8B.
Figure 10:
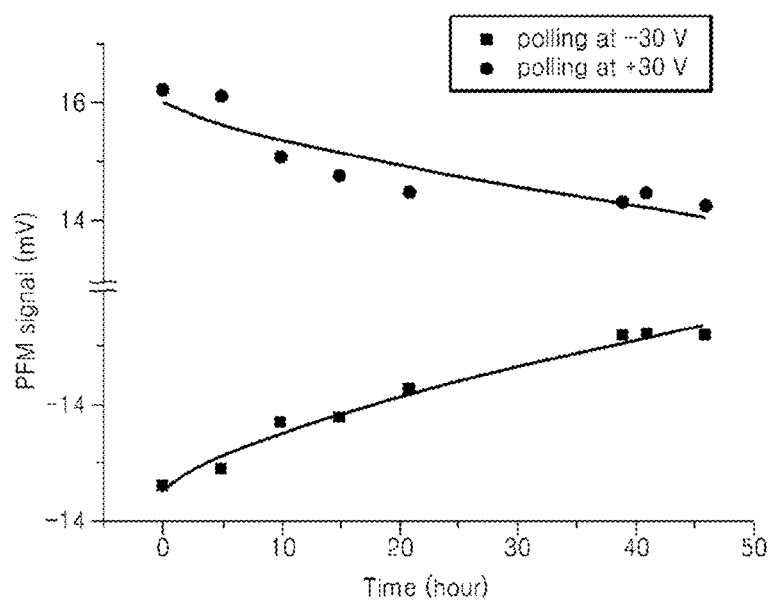
FIG. 10 is a graph showing a variation in the PFM signal according to the time elapse with respect to the sample of FIGS. 8A and 8B.

FIGS. 8A and 8B are polarization state images taken when polarization is generated and a predetermined time period (about 46 hours) has passed after the polarization, in a case where the P(VDF-TrFE) in which the piezoelectric inorganic nano-particles are dispersed is crystallized at a temperature of about 140° C., according to an exemplary embodiment. FIG. 8A shows a state when the polarization is generated (0 hour), and FIG. 8B shows a polarization state when about 46 hours have passed since the polarization (46 hour). FIG. 9 shows a piezoelectric force microscopy (PFM) signal variation according to locations in the sample of FIGS. 8A and 8B, and FIG. 10 shows a variation in the PFM signal according to the time elapse with respect to the sample of FIGS. 8A and 8B. According to the graphs of FIGS. 9 and 10, in the sample of FIGS. 8A and 8B, a left polarization and a right polarization have opposite polarities to each other.

As shown in FIGS. 8A, 8B, 9 and 10, when the P(VDF-TrFE) is crystallized at the sufficiently high temperature of about 140° C. and is in a high crystalline state, polarization may be maintained well as time elapses.

Figure 11A:
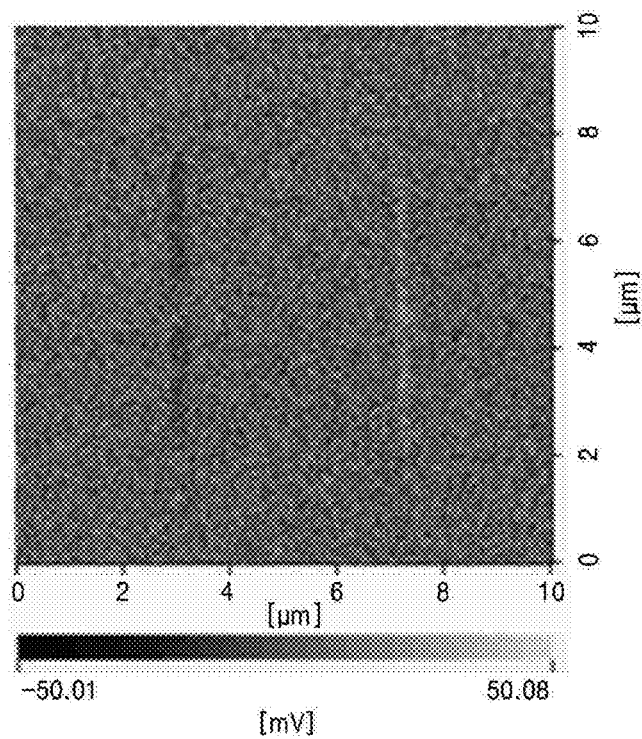
FIGS. 11A and 11B show polarization state images taken when the polarization is generated (0 hour) and a predetermined time period (about 44 hours) has passed after the polarization, in a case where the P(VDF-TrFE) in which the piezoelectric inorganic nano-particles are dispersed is crystallized at a temperature of about 80° C. according to an exemplary embodiment.
Figure 11B:
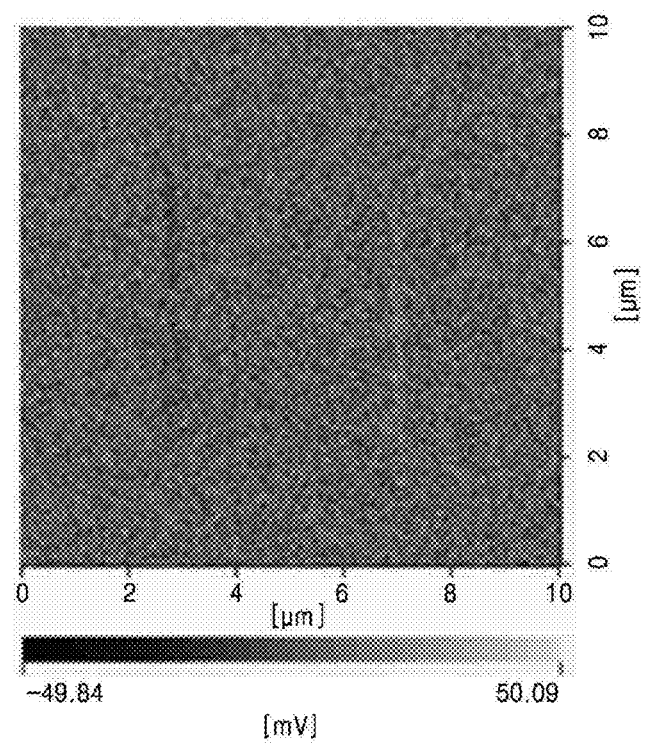
Figure 12:
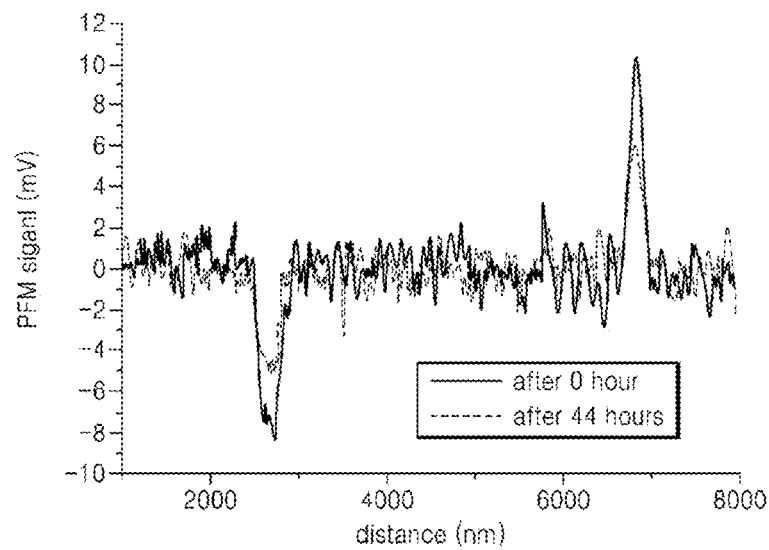
FIG. 12 shows a piezoelectric force microscopy (PFM) signal variation according to locations in the sample of FIGS. 11A and 11B.
Figure 13:
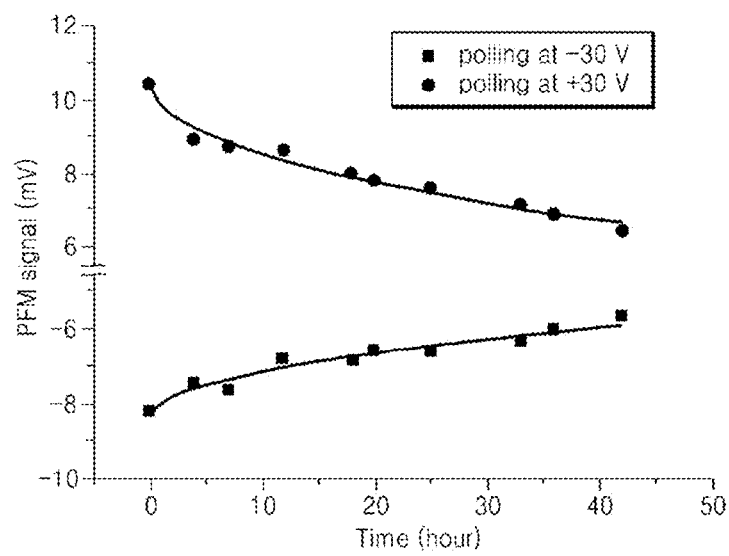
FIG. 13 shows a variation in the PFM signal according to the time elapse with respect to the sample of FIGS. 11A and 11B according to an exemplary embodiment.

FIGS. 11A and 11B show polarization state images taken when polarization is generated and a predetermined time (about 44 hours) has passed after the polarization, in a case where the P(VDF-TrFE) in which the piezoelectric inorganic nano-particles are dispersed is crystallized at a temperature of about 80° C. according to an exemplary embodiment. FIG. 11A shows the polarization state image when the polarization is generated (0 hour), and FIG. 11B shows the polarization state image after about 44 hours (44 hour) have passed after the polarization. FIG. 12 shows a piezoelectric force microscopy (PFM) signal variation according to locations in the sample of FIGS. 11A and 11B, and FIG. 13 shows a variation in the PFM signal according to the time elapse with respect to the sample of FIGS. 11A and 11B. According to the graphs of FIGS. 12 and 13, in the sample of FIGS. 11A and 11B, a left polarization and a right polarization have opposite polarities to each other.

As shown in FIGS. 11A through 13, when the P(VDF-TrFE) is crystallized at a low temperature of about 80° C. and in a low crystalline state, the polarization may not be maintained well as time elapses when compared with that of the high crystalline state.

Referring back to FIG. 1, the power unit 70 is electrically connected to the gate electrode 31 of the sensor TFT 30 and is configured to apply an alternating current (AC) signal to the gate electrode 31 of the sensor TFT 30 during a pressure sensing operation.

The pressure sensing unit 100 senses pressure by using a drain current $I_D$ obtained from the sensor TFT 30 in a state where the AC signal is applied to the gate G1 of the sensor TFT 30. That is, the pressure sensing unit 100 obtains a remnant polarization value $P_r$ from the drain current $I_D$, and calculates the pressure from the remnant polarization value $P_r$.

Figure 14:
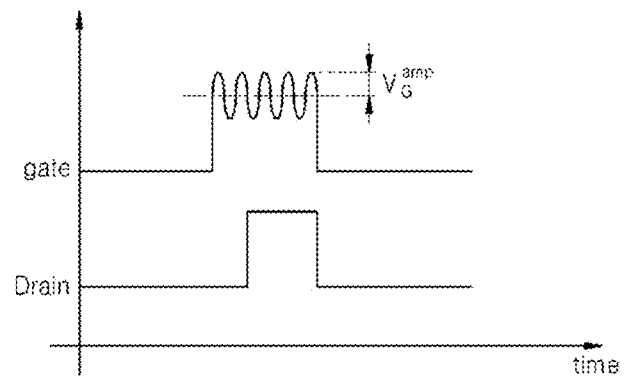
FIG. 14 is a graph showing examples of a gate voltage $V_{gate}$ and a drain voltage $V_{DD}$ applied to a sensor TFT according to an exemplary embodiment.

FIG. 14 is a graph showing examples of a gate voltage $V_{gate}$ and a drain voltage $V_{DD}$ applied to the sensor TFT 30. As shown in FIG. 14, the gate voltage applied to the gate G1 may be a type in which an AC sine wave signal is added to a direct current (DC) component, although it is not limited thereto.

Figure 15:
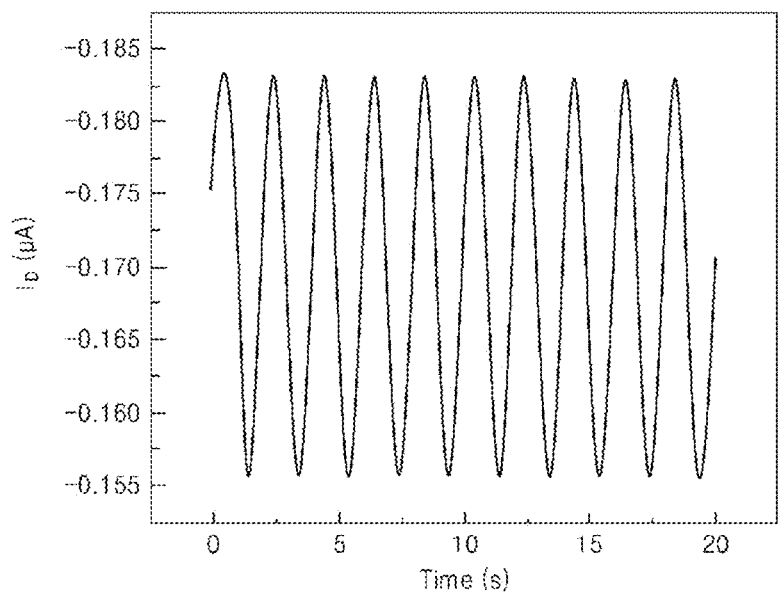
FIG. 15 is a graph showing a drain current in the form of a sine wave, which is obtained when an AC signal is applied to the gate of the sensor TFT according to an exemplary embodiment.

As described above, when the gate voltage, in which the AC sine wave signal is added to the DC component, is applied to the gate G1, the drain current $I_D$ in the form of a sine wave is generated in response and obtained. Equation 1 below expresses an AC sine wave signal $V_G$ applied to the gate G1, and Equation 2 and FIG. 15 show the drain current $I_D$ obtained in the form of the sine wave. In FIG. 15, scales of transverse and longitudinal axes are exemplary and not absolute values.

$$V_G = V_G^{amp} \sin(\omega t + \phi_{VG}) \quad \text{Equation (1)}$$

$$I_D = I_D^{mean} + I_D^{amp} \sin(\omega t + \phi_{ID}) \quad (2)$$

In Equation 1, $V_G^{amp}$ denotes an amplitude of a gate bias, that is, an amplitude of the AC sine wave signal, and in equation 2, $I_D^{mean}$ denotes an average value of the drain current and $I_D^{amp}$ denotes an amplitude of the drain current.

According to an exemplary embodiment, $I_D^{mean}$ and $I_D^{amp}$ have the following relationships with a channel width W and a channel length L of the sensor TFT 30, as expressed by Equation 3:

$$I_D^{mean} = -\mu C \frac{W}{L} V_D V_0 \quad \text{Equation (3)}$$

$$I_D^{amp} = -\mu C \frac{W}{L} V_D V_G^{amp}$$

In Equation 3, $V_D$ denotes a drain voltage and $V_0$ denotes a gate voltage at which electric current starts to flow in the sensor TFT 30.

From Equation 3, the gate voltage $V_0$ may be calculated by using Equation 4 below, and a relationship between the remnant polarization value $P_r$ and $V_0$ may be expressed by Equation 5. That is, as shown in Equation 4 and Equation 5, the remnant polarization value $P_r$ is in proportion to $$V_G^{amp} \frac{I_D^{mean}}{I_G^{amp}}.$$

$$V_0 = V_G^{amp} \frac{I_D^{mean}}{I_D^{amp}} \quad \text{Equation (4)}$$

$$P_r = \varepsilon_0 \varepsilon_r \frac{V_0}{d} \quad \text{Equation (5)}$$

In Equation 5, $\varepsilon_0$ is about $8.854 \times 10^{-14}$ F/cm, $\varepsilon_r$ denotes a dielectric constant, and d denotes a thickness of the gate insulating layer 33.

Therefore, the piezoelectric coefficient $d_{33}$ may be obtained from the remnant polarization value $P_r$ by using Equation 6. Also, when the piezoelectric coefficient is already acknowledged, the pressure sensor 10 may measure the pressure by using the remnant polarization value $P_r$ calculated by using Equation 5. In Equation 6 below, $\sigma_3$ denotes stress applied to a predetermined location of the pressure sensor 10.

$$d_{33} = \frac{\Delta P_r}{\Delta \sigma_3} \quad \text{Equation (6)}$$

Figure 16:
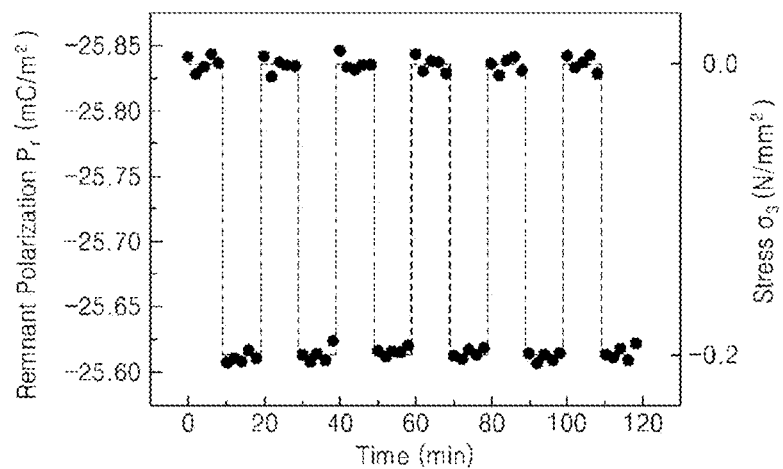
FIG. 16 is a graph showing changes of a remnant polarization $P_r$ value when a pressure is applied and not applied according to an exemplary embodiment.

The remnant polarization value $P_r$ may be distinguishable according to the pressure. FIG. 16 shows changes of the remnant polarization value $P_r$ when the pressure is applied and not applied. As shown in FIG. 16, the remnant polarization values $P_r$ obtained when the pressure is applied and when the pressure is not applied are distinctively different from each other, and therefore, the remnant polarization value $P_r$ may be used to determine (e.g., sense) whether the pressure is applied or not applied.

Figure 17:
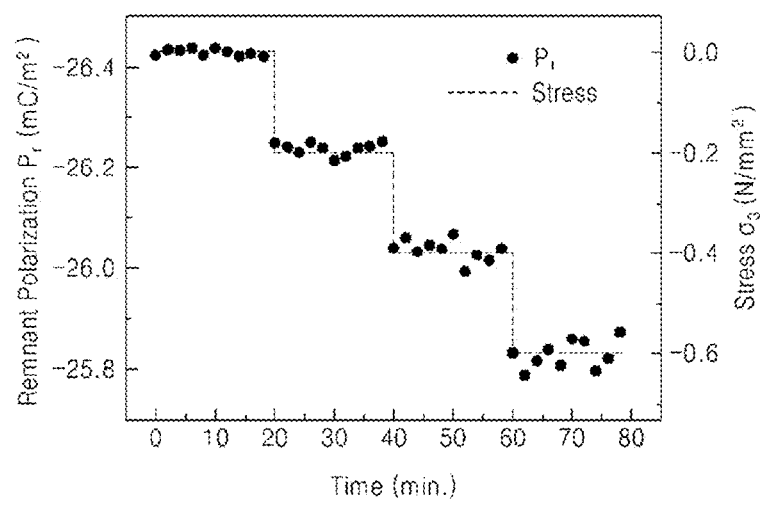
FIG. 17 is a graph showing a variation in the remnant polarization $P_r$ values obtained while gradually changing the applied pressure according to an exemplary embodiment.

FIG. 17 is a graph showing a variation in the remnant polarization values $P_r$ obtained while gradually changing the applied pressure. As shown in FIG. 17, the obtained remnant polarization values $P_r$ may vary depending on the applied pressure, and accordingly, the pressure may be sensed in various pressure levels.

Also, as shown in FIG. 6, since the piezoelectric coefficient $d_{33}$ may vary depending on the amount of the $BaTiO_3$ piezoelectric nano-particles included in the P(VDF-TrFE) matrix, the gate insulating layer 33 may be formed by adjusting the content amount of the piezoelectric inorganic nano-particles so as to obtain a piezoelectric coefficient at which the pressure sensing may be performed precisely and accurately, thereby realizing a pressure sensor 10 that is accurate and sensitive.

According to an exemplary embodiment, the gate insulating layer 33 is formed to have a structure in which the piezoelectric inorganic nano-particles are dispersed in the organic material, and thus, the sensitivity of the pressure sensor 10 with respect to the pressure under limited piezoelectric characteristics may be greatly improved.

In the pressure sensor 10 according to an exemplary embodiment, the sensor TFT 30 may be formed to show a positive piezoelectric coefficient $d_{33}$ of, for example, about 120 to about 960 pC/N.

According to the pressure sensor 10 of an exemplary embodiment, when the pressure sensing operation is performed, the AC signal is applied to the gate G1 of the sensor TFT 30 which functions as an input terminal of the pressure sensor 10 in order to sense the drain current $I_D$ and the gate voltage $V_0$. To do this, the AC signal input to the gate G1 of the sensor TFT 30 may have a frequency ranging from about 0.001 Hz to about 1 GHz. The AC signal may have a voltage amplitude ranging from about 0.01 V to about 100 V.

The pressure sensing unit 100 detects the remnant polarization value $P_r$ value that is in proportion to a value of $$V_G^{amp} \frac{I_D^{mean}}{I_D^{amp}}$$

by using the sensed drain current $I_D$ and $V_0$ so as to sense the applied pressure in multiple levels by using the variation in the remnant polarization value $P_r$. That is, the variation in the pressure and the absolute value of the pressure may be obtained.

According to the pressure sensor 10 of an exemplary embodiment, since the piezoelectric inorganic nano-particles having excellent piezoelectric characteristics are dispersed in the organic material of the gate insulating layer 33, the flexible substrate may be used as the substrate 1, and at the same time, the pressure sensor may be manufactured through a low temperature process while having the excellent piezoelectric characteristics of the inorganic material.

Also, according to the pressure sensing method of an exemplary embodiment, the AC signal is applied to the gate G1 of the sensor TFT 30 which has the piezoelectric gate insulating layer 33 when performing the pressure sensing operation, and thus, the variation amount of the drain current according to the pressure variation may be increased, and accordingly, the sensitivity with respect to the pressure may also be increased.

The pressure sensor 10 according to the exemplary embodiments may be applied to flexible or stretchable electronic components. Applicable ranges of the stretchable electronic components may contribute to products in new application fields, and the application fields may be widely expandable to large-sized sensors, actuators, memories, solar batteries, electronic devices capable of charging by themselves, etc.

It should be understood that the exemplary embodiments described herein should be considered in a descriptive sense only and not for purposes of limitation. Descriptions of features or aspects within each exemplary embodiment should typically be considered as available for other similar features or aspects in other exemplary embodiments.

What is claimed is:

1. A pressure sensor comprising:
a substrate;
a sensor thin film transistor (TFT) disposed on the substrate and comprising a gate insulating layer, wherein the gate insulating layer comprises an organic matrix in which piezoelectric inorganic nano-particles are dispersed;
a power unit configured to apply an alternating current (AC) signal to a gate of the sensor TFT; and
a pressure sensing unit configured to obtain a remnant polarization value based on a drain current which is generated in response to the AC signal and detected by the sensor TFT, and to sense pressure based on the remnant polarization value.

2. The pressure sensor of claim 1, wherein when an amplitude of the AC signal applied to the gate is $V_G^{amp}$, an amplitude of the drain current is $I_D^{amp}$, and an average drain current value is $I_D^{mean}$, the remnant polarization value is in proportion to a value of $$V_G^{amp} \frac{I_D^{mean}}{I_D^{amp}},$$

and the pressure sensor is configured to sense the pressure by using a variation in the remnant polarization value.

3. The pressure sensor of claim 1, wherein the AC signal has a frequency ranging from about 0.001 Hz to about 1 GHz.

4. The pressure sensor of claim 1, wherein a voltage amplitude of the AC signal ranges from 0.01 V to 100 V.

5. The pressure sensor of claim 1, wherein the organic matrix comprises a piezoelectric organic material.

6. The pressure sensor of claim 5, wherein the piezoelectric organic material is selected from P(VDF-TrFE), P(VDF-TrFE-CFE), and P(VDF-TrFE-CtFE).

7. The pressure sensor of claim 5, wherein the organic matrix has a crystalline structure.

8. The pressure sensor of claim 5, wherein the piezoelectric inorganic nano-particles are selected from the group consisting of gallium orthophosphate ($GaPO_4$), langasite ($La_3Ga_5SiO_{14}$), a quartz analogic crystal, barium titanate ($BaTiO_3$), lead titanate ($PbTiO_3$), lead zirconate titanate ($Pb[Zr_xTi_{1-x}]O_3$ ($0 \leq x \leq 1$), potassium niobate ($KNbO_3$), lithium niobate ($LiNbO_3$), lithium tantalate ($LiTaO_3$), sodium tungstate ($Na_2WO_3$), zinc oxide ($Zn_2O_3$), $Ba_2NaNb_5O_5$, $Pb_2KNb_5O_{15}$, sodium potassium niobate ((K, Na)$NbO_3$), bismuth ferrite ($BiFeO_3$), sodium niobate ($NaNbO_3$), bismuth titanate ($Bi_4Ti_3O_{12}$), and sodium bismuth titanate ($Na_{0.5}Bi_{0.5}TiO_3$).

9. The pressure sensor of claim 1, further comprising a switching TFT that is electrically connected to the sensor TFT, wherein a sensor pixel structure of the pressure sensor comprises one switching TFT and one sensor TFT.

10. The pressure sensor of claim 1, wherein the organic matrix has a crystalline structure.

11. The pressure sensor of claim 10, wherein the organic matrix is formed to have the crystalline structure through an annealing process which implements a temperature of 120° C. or higher.

12. The pressure sensor of claim 1, wherein the substrate is a flexible substrate, wherein the substrate is formed of a material including polyimide.

13. A pressure sensing method comprising:
applying an alternating current (AC) signal to a gate of a sensor thin film transistor (TFT) comprising a piezoelectric gate insulating layer;
detecting a drain current from the sensor TFT, the drain current being generated in response to the AC signal;
obtaining a remnant polarization value based on the drain current; and
sensing a pressure based on the remnant polarization value,
wherein when an amplitude of the AC signal applied to the gate is $V_G^{amp}$, an amplitude of the drain current is $I_D^{amp}$, and an average drain current value is $I_D^{mean}$, the remnant polarization value is in proportion to a value of $$V_G^{amp} \frac{I_D^{mean}}{I_D^{amp}},$$

and the sensing the pressure comprises sensing the pressure by using a variation in the remnant polarization value.

14. The pressure sensing method of claim 13, wherein the AC signal has a frequency from about 0.001 Hz to about 1 GHz.

15. The pressure sensing method of claim 13, wherein a voltage amplitude of the AC signal ranges from 0.01 V to 100 V.

16. The pressure sensing method of claim 13, wherein the piezoelectric gate insulating layer comprises an organic matrix, in which piezoelectric inorganic nano-particles are dispersed, wherein the organic matrix comprises a piezoelectric organic material.

17. The pressure sensing method of claim 16, wherein the piezoelectric organic material is selected from P(VDF-TrFE), P(VDF-TrFE-CFE), and P(VDF-TrFE-CtFE).

18. The pressure sensing method of claim 16, wherein the piezoelectric inorganic nano-particles are selected from the group consisting of gallium orthophosphate ($GaPO_4$), langasite ($La_3Ga_5SiO_{14}$), a quartz analogic crystal, barium titanate ($BaTiO_3$), lead titanate ($PbTiO_3$), lead zirconate titanate ($Pb[Zr_xTi_{1-x}]O_3$ (0≤x≤1), potassium niobate ($KNbO_3$), lithium niobate ($LiNbO_3$), lithium tantalate ($LiTaO_3$), sodium tungstate ($Na_2WO_3$), zinc oxide ($Zn_2O_3$), $Ba_2NaNb_5O_5$, $Pb_2KNb_5O_{15}$, sodium potassium niobate ((K, Na)$NbO_3$), bismuth ferrite ($BiFeO_3$), sodium niobate ($NaNbO_3$), bismuth titanate ($Bi_4Ti_3O_{12}$), and sodium bismuth titanate ($Na_{0.5}Bi_{0.5}TiO_3$).

19. A pressure sensor comprising:
a substrate comprised of a flexible material;
a sensor thin film transistor (TFT) disposed on the substrate and comprising a gate insulating layer, wherein the gate insulating layer comprises a combination of an organic material and an inorganic material; and
a pressure sensing unit configured to obtain a remnant polarization value based on a drain current detected by the sensor TFT, and to sense pressure based on the remnant polarization value,
wherein when an amplitude of an AC signal applied to a gate of the sensor TFT is $V_G^{amp}$, an amplitude of the drain current is $I_D^{amp}$, and an average drain current value is $I_D^{mean}$, the remnant polarization value is in proportion to a value of $$V_G^{amp} \frac{I_D^{mean}}{I_D^{amp}},$$

and the pressure sensing unit is configured to sense the pressure by using a variation in the remnant polarization value.

* * * * *